(12) United States Patent
Mair et al.

(10) Patent No.: US 6,329,850 B1
(45) Date of Patent: Dec. 11, 2001

(54) PRECISION FREQUENCY AND PHASE SYNTHESIS

(75) Inventors: Hugh Mair, Allen; Liming Xiu, Plano, both of TX (US); Shawn A. Fahrenbruch, Tustin, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/472,268

(22) Filed: Dec. 27, 1999

(51) Int. Cl.$^7$ .................................................. H03B 21/00
(52) U.S. Cl. .......................... 327/107; 327/156; 327/105; 708/271
(58) Field of Search ..................... 327/156, 146, 327/105, 113, 107; 708/271, 272, 270

(56) References Cited

U.S. PATENT DOCUMENTS 5,126,960 * 6/1992 Thong .................................. 364/721
5,841,387 * 11/1998 VanBuskirk .......................... 341/155

* cited by examiner

*Primary Examiner*—Dinh T. Le
(74) *Attorney, Agent, or Firm*—J. Dennis Moore; W. James Brady, III; Frederick J. Telecky, Jr.

(57) ABSTRACT

An electronic system, such as a video decoder (80), includes a clock generator circuit (22, 22') based upon a phase-locked loop (PLL) (25). The PLL (25) includes a voltage controlled oscillator (VCO) (30) that produces a plurality of evenly-spaced output phases, each of a locked frequency relative to a reference clock (CREF). A frequency synthesis circuit (27) receives a frequency selection value on control lines (FREQ) that include an integer and a fraction portion. The integer and fraction portion of the frequency selection value are added to the current contents of a register (40) that stores the previous integer value used to select the corresponding phase from VCO (30) for application to the clock input of a toggle flip-flop (36) from which the output clock (COUT) is generated. Use of the fraction portion permits a time-averaged clock frequency to be produced with more precision than the multiple phases output by the VCO (30). Alternative embodiments include multiple frequency synthesis circuits (27) based upon the same PLL (25), and the generation of a phase-shifted secondary output from a phase synthesis circuit (29) that is slaved to the frequency synthesis circuit (27). Additional performance is obtained by providing separate paths (52a, 52b) for producing the leading and trailing edges of the output clock (COUT).

24 Claims, 5 Drawing Sheets

PRECISION FREQUENCY AND PHASE SYNTHESIS

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of integrated circuits, and is more specifically directed to such circuits for generating periodic signals of selected frequency and phase characteristics.

As is fundamental in the art, many modern electronic systems now include numerous integrated circuits that operate in conjunction with one another. In complex high performance systems such as modern personal computers and workstations, these integrated circuits typically operate in a synchronous manner relative to a system clock. In consumer-oriented systems such as televisions and home theaters, operation is synchronized with respect to a synchronization pulse that is included within the display signal itself. In these and other electronic systems, the generation of periodic signals for clocking the operation of circuit functions, with such generated signals based upon the system clock or synchronization pulse, is a common and somewhat critical function.

A conventional approach for generating periodic signals based upon a reference clock utilizes the well-known phase-locked loop, or PLL. In general, PLL circuits operate by comparing the time at which an edge of the reference clock is received relative to a corresponding edge of an internally generated clock. If a significant delay between these two edges is detected, the generation of the internal clock is adjusted to more closely match the received reference clock. In conventional analog PLLs, the frequency of a periodic signal produced by a voltage controlled oscillator is adjusted in response to a filtered signal from a phase detector, such that the instantaneous frequency of the internal chip clock is advanced or retarded depending upon whether the chip clock lags or leads the system clock. Analog PLLs therefore adjust the phase of the chip clock in a substantially continuous manner in response to a phase difference between the internal chip clock and the system clock; this smooth operation generally depends upon the filtering of the output of the phase detector circuit, but can be made quite wellbehaved in most implementations. Additionally, with the use of frequency dividers in the forward and feedback loops, analog PLLs can be used to generate periodic signals of a selectable frequency multiple of the input reference clock.

Modern digital integrated circuits generally use digital circuitry to generate multiple internal chip clocks that are based upon the output of a PLL. The digitally-generated clock signals can only be adjusted to a discrete accuracy that corresponds to the minimum step size of the digital clock generation circuitry. This incremental change in phase is often noticeable, particularly at high frequencies. The resulting "phase jitter" is now a commonly specified parameter for digital clock circuitry, as this effect is often a limiting factor in the accuracy and performance of the circuit.

In addition to phase jitter, the performance of PLL-based clock circuits in response to phase drift is another important parameter. Phase drift, which refers to the variation in the phase of a generated clock relative to the reference clock over time, can be caused by the accumulation of error over a number of clock cycles. Additionally, phase drift can also be caused by temperature and power supply voltage variations, and system noise.

Certain applications of clock generation circuitry are more sensitive to one of these parameters than to the other. A particularly difficult circuit application of clock generation circuitry is video decoding to convert television signals (transmitted or recorded) into digital data for computer display or digital video processing. As is well known in the art, conventional television signals included a synchronization pulse at the beginning of each scan line; in the case of a broadcast signal, this synchronization pulse is transmitted, while in the case of a video tape, the synchronization pulse is part of the recorded information. Color information is communicated within each scan line by way of the phase relationship of the color burst signal for each horizontal display location to the synchronization pulse. In order to achieve the desired accuracy in the displayed image, a video decoder system must be able to resolve relatively small phase variations (e.g., on the order of 10°) in the color burst signal which occur at relatively long times (e.g., as long as 60 $\mu$sec after a 6 MHz synchronization pulse). In order to carry out the desired video decoding of such a signal, the video decoder must be capable of generating a clock signal that has very little drift over time, for example with as little as 1 nsec drift over 60 $\mu$sec.

The concept of using multiple phases of a PLL-generated clock signal to synthesize frequency is known in the art, as will now be described with reference to FIG. 1. FIG. 1 illustrates an exemplary PLL-based clock circuit 2 utilizing this known concept. Clock circuit 2 includes a phase-locked loop (PLL) that includes phase-frequency detector (PFD) 4 for comparing the relative phases of a reference clock on line CREF and a feedback clock on line CFB; the output of PFD 4 is applied to charge pump 6, in the conventional manner, which generates a voltage level corresponding to the phase difference between the reference and feedback clocks CREF, CFB, respectively. This voltage level, after filtering by low pass filter 8, is applied to a control input of voltage controlled oscillator (VCO) 10. VCO 10, in the conventional manner, generates a periodic waveform at a frequency controlled by this voltage at its control input, from charge pump 6. Accordingly, the frequency of the clock signal or signals generated by VCO 10 is controlled according to the phase relationship of the reference and feedback clocks CREF, CFB, applied to PFD 4, as will become apparent from the following description.

In this clock circuit 2, VCO 10 provides multiple phases (numbering n in this example) of the periodic clock signal. As shown in FIG. 1, these multiple phases are evenly spaced relative to one another over a period of the output signal. For example, considering output clock signal $C_0$ as a baseline, VCO 10 in this example also generates a clock signal $C_1$ that lags clock signal $C_0$ by phase lag $\Delta_1$; additional clock signals $C_i$ are produced which lag clock signal $C_0$ by a phase lag corresponding to index i times the phase lag $\Delta_1$. The nth clock signal $C_n$ lags clock signal $C_0$ by a phase lag $\Delta_n$, which equals $n\Delta_1$, in this example. One of these clock signals is used as feedback clock CFB, after division by frequency divider 12. The provision of frequency divider 12 permits the base frequency of VCO 10 to differ from that of the reference clock CREF.

In operation, of course, the PLL portion of clock circuit 2 generates a periodic signal from VCO 10 that has its frequency adjusted so that the feedback clock on line CFB becomes phase-synchronous with the reference clock CREF. For example, if reference clock CREF leads feedback clock CFB, as detected by PFD 4, charge pump 6 adjusts the voltage at its output to control VCO 10 to increase the frequency of its output clock signals C; conversely, if reference dock CREF lags feedback clock CFB, charge pump 6 adjusts the voltage at its output in the other direction, to control VCO 10 to reduce the frequency of its output clocks. After a sufficient number of cycles, and assuming a relatively stable reference clock CREF, the periodic clocks generated by VCO 10 will be locked onto the reference clock CREF, providing stable operation.

Clock circuit 2 digitally generates an output clock COUT at a selected frequency, in this example, through the operation of multiplexer 14 and D-type flip-flop 16. Multiplexer 14 has a plurality of inputs, each receiving one of the output clock signals C from VCO 10. As noted above, the clock signals C all are at the same frequency but at varying phase relative to one another. The output of multiplexer 14 is applied to the clock input of flip-flop 16, which has its inverting output connected to its D input in toggle form. Accordingly, each rising edge of the selected clock signal C applied by multiplexer 14 clocks the state at the inverting output of flip-flop 16 into its D input, changing the state of flip-flop 16 and thus inverting its output on line COUT. In this manner, the selected phase from VCO 10 operates to effect a half cycle of the output clock signal on line COUT.

Control of the selection of the clock signals by multiplexer 14 is carried out by register 18 and adder 20, in this example. A digital frequency selection is applied on lines FREQ to one input of adder 20, indicating the number of successive phases from VCO 10 that are to elapse between generation of the leading and trailing edges of output clock COUT. The output of adder 20 is applied to register 18 for storage, clocked in by the selected phase from the output of multiplexer 14; the output of register 18 is then applied to the select inputs of multiplexer 14. In this conventional clock circuit 2, where n phases are generated by VCO 10, the number of digital lines FREQ are $\log_2 n$, as are the number of lines communicated from the output of adder 20 to register 18, and from register 18 to multiplexer 14 and to an input of adder 20.

In operation, the current selection value applied to multiplexer 14 by register 18 is added to the phase increment signal on lines FREQ to generate the next edge selection value for use by multiplexer 14. For example, consider the case in which thirty-two phases are issued by VCO 10 in each period of its output clock signals (i.e., n=32). If an edge is to be issued every four phases of the clock signals C from VCO 10, lines FREQ will carry the value $4_{10}$ or $00100_2$. In each cycle, adder 20 will add this value of four to the current selection value applied to multiplexer 14, with the sum selecting the next edge that is to be applied to flip-flop 16 to toggle its output In this example, where lines FREQ conveys the value $4_{10}$, the output clock COUT will make a transition every four phases from VCO 10, or eight times within each period of the clock signals C from VCO 10. In effect, therefore, the clock signal COUT will be at four times the frequency of VCO 10, in that a cycle of output clock signal COUT is completed upon every two selected edges from the output of multiplexer 14. The theoretical range of selectable frequencies thus ranges from one-half the frequency of VCO 10 (for FREQ=0, such that the same edge is selected in each cycle), to n/2 times the frequency of VCO 10 (for FREQ=1, so that each phase of clock signals C is issued by multiplexer 14).

According to this known concept, however, the resolution with which the frequency of the synthesized clock signal at line COUT may be selected depends upon the number n of phases of clock signals C generated by VCO 10. For a given VCO frequency, further resolution is obtained only by greatly increasing the complexity of VCO 10 to provide more clock phases at its output. As a result, the applicability of digital clock circuit 2 to extremely precise applications such as video decoders is quite limited.

BRIEF SUMMARY OF THE INVENTION

It is therefore an object of the present invention to provide a frequency and phase synthesis circuit which is capable of generating a clock signal over a precisely programmable range of frequencies.

It is a further object of the present invention to provide such a circuit in which phase drift is precluded from accumulating over many cycles.

It is a further object of the present invention to provide such a circuit in which multiple clock signals may be readily generated at a fixed phase relationship relative to the first.

It is a further object of the present invention to provide such a circuit in which multiple frequencies of clock signals may be based upon a single phase-locked loop.

It is a further object of the present invention to provide a multiple path synthesis circuit for supporting high frequency operation.

It is a further object of the present invention to provide such a circuit in which the duty cycle of the output clock signal may be selected.

Other objects and advantages of the present invention will be apparent to those of ordinary skill in the art having reference to the following specification together with its drawings.

The present invention may be implemented into a phase-locked loop (PLL) frequency synthesis circuit, in which the voltage controlled oscillator (VCO) of the PLL generates multiple phases of its output clock signal. A multiplexer selects phases of the VCO output according to the integer portion of a register having integer and fraction portions; the integer value selects one of the phases output by the VCO. Each selected phase generates a transition of the output clock signal. The contents of the register correspond to the addition of a frequency select signal with the current register contents, including the integer and fraction. An average output frequency is obtained that may be precisely set beyond the resolution provided by the VCO phases, as the carry from the accumulated fractional portion of the register contents periodically modulates the select address applied to the multiplexer.

DETAILED DESCRIPTION OF THE INVENTION

Figure 2:
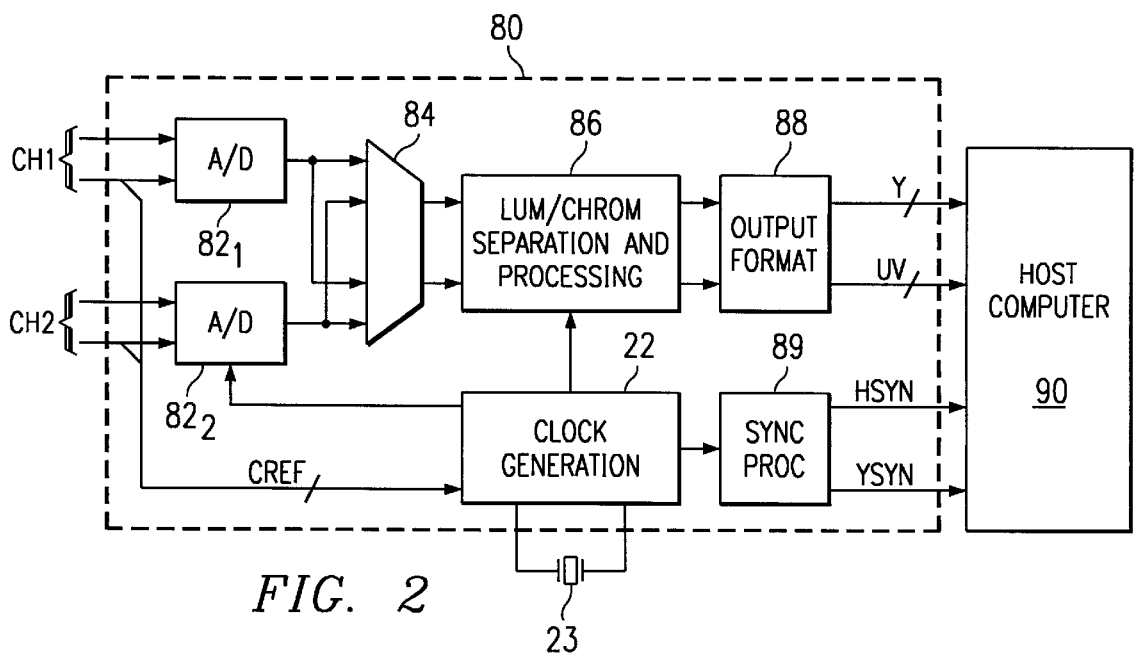
FIG. 2 is an electrical diagram, in block form, of a video decoder including a clock generation circuit constructed according to the preferred embodiments of the invention.

Referring now to FIG. 2, an exemplary implementation of the present invention in connection with a video decoder will now be described. As will be described hereinbelow, the present invention is particularly beneficial when applied to the application of decoding a color video signal, considering the extremely low drift achievable by way of the present invention. Those skilled in the art having reference to this specification will readily comprehend, however, that the present invention may also be used in connection with other frequency synthesis applications, with particular benefit in connection with those applications in which phase drift is to be minimized. Accordingly, it is contemplated that those skilled in the art will recognize that the following description is presented by way of example only.

As shown in the exemplary system of FIG. 2, video decoder 80 receives two input channels CH1, CH2 of video signals; the video signals on channels CH1, CH2 in this example are analog signals, such as according to the NTSC standard. The output of video decoder 80, as presented to host computer 90 in the example of FIG. 2, are digital signals corresponding to the display information presented on lines Y, UV, and horizontal and vertical synchronization signals on lines HSYN, VSYN, respectively. Based on these decoded digital signals, host computer 90 processes these digital signals as desired by the user, for example to perform digital image processing thereto, digital video capture, and digital video and image editing, as well as to display the decoded information on a display monitor (not shown) directly or over a video conferencing system.

Video decoder 80 in this exemplary implementation includes circuitry for performing video decoding operations, similar to the TVP5020 video decoder available from Texas Instruments Incorporated. In this regard, video decoder 80 includes analog-to-digital conversion functions (A/D) $82_1$, $82_2$ for sampling and filtering the analog input video signals on channels CH1, CH2, respectively; automatic gain control and other analog processing may also be applied as desired. The digital outputs from (A/D) $82_1$, $82_2$, including both luminance and chrominance information, are applied by way of multiplexer 84 to luminance and chrominance separation and processing function 86. Upon the desired processing performed by function 86, digital information useful by host computer 90 is generated, via output formatter 88, and communicated to host computer 90 over digital lines Y, UV. Additionally, sync processor 89 generates the appropriate timing information corresponding to vertical and horizontal synchronization signals, and presents the same to host computer 90 by clock signals on lines VSYN, HSYN, respectively.

In order for the operation of luminance and chrominance separation and processing function 86 to accurately decode the incoming video signals, function 86 must be properly synchronized with the sync information contained within the incoming signals CH1, CH2. According to the preferred embodiments of the invention, therefore, video decoder 80 includes clock generation circuit 22 which receives a reference clock signal on line CREF that is based upon external crystal 23, and which generates the appropriate internal clock signals for application to function 86, as well as to A/D functions 82 and sync processor 89. The frequencies and phases of these various clock signals generated by clock generation circuit 22 may vary for each of the respective functions in video decoder 80, as will be described hereinbelow.

Figure 3:
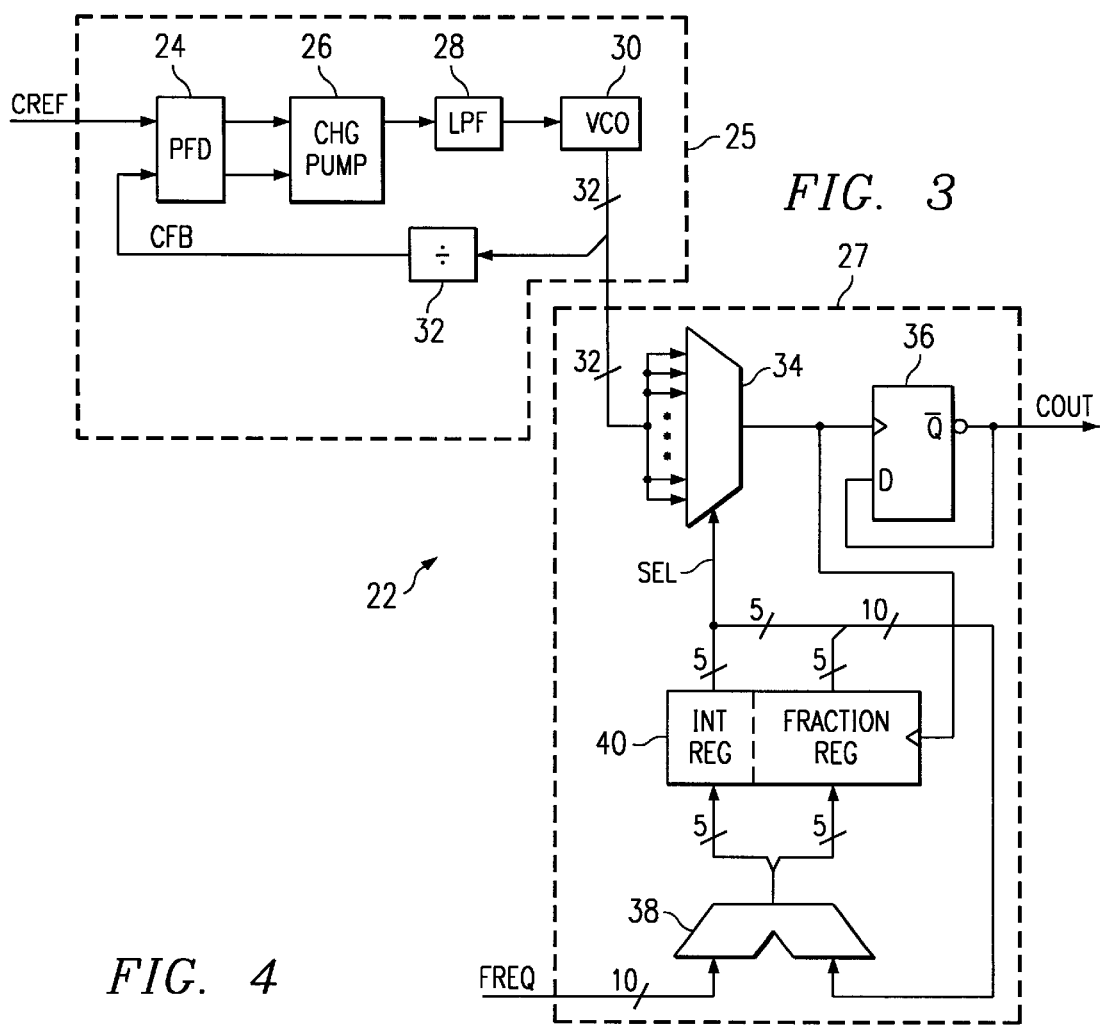
FIG. 3 is an electrical diagram, in block and schematic form, of a clock generation circuit constructed according to a first preferred embodiment of the invention.

Referring now to FIG. 3, the construction of clock generation circuit 22 according to a first preferred embodiment of the present invention will now be described. Clock generation circuit 22 is a phase-locked loop (PLL) based clock circuit, and as such includes PLL 25 which generates multiple phases of a clock signal, phase-locked to a reference clock received on line CREF. Clock generation circuit 22 according to this preferred embodiment of the invention also includes frequency synthesis circuit 27 which, as will be described in further detail hereinbelow, receives the multiple phases of the clock signal generated by PLL 25 and generates an output clock signal on line COUT based thereupon. The frequency of the output clock signal on line COUT from frequency synthesis circuit 27 is set by the digital value applied on lines FREQ from control logic of the integrated circuit or system within which clock generation circuit 22 is implemented. The digital value on lines FREQ corresponds, in the preferred embodiments of the present invention, to a multiple of the frequency of the clock signal generated by PLL 25. As will become evident from the following description, the number of lines FREQ applied to frequency synthesis circuit 27 is greater than the number required to uniquely select individual phases of the output of PLL 25; in other words, if m phases are generated by PLL 25 in each cycle of its output clock, the number of lines FREQ is greater than $\log_2 m$. This enables additional precision in the selection of the time-averaged frequency of the output clock signal on line COUT, while ensuring minimal phase drift, as will be described below.

Figure 4:
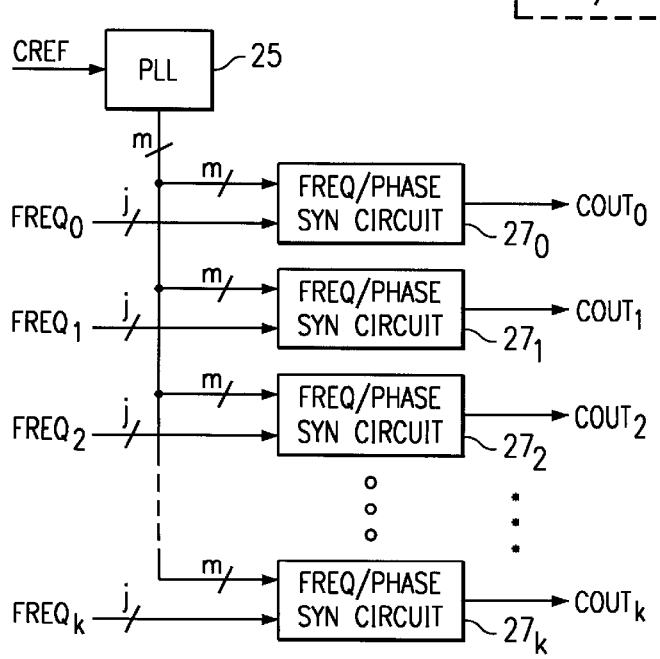
FIG. 4 is an electrical diagram, in block form, of an alternative implementation of the clock generation circuit according to the preferred embodiments of the invention, in which multiple frequency and phase synthesis circuits operate based upon the output of one phase-locked loop.

According to the present invention, multiple frequency and phase synthesis circuits 27 may be implemented within clock generation circuit 22, for generating multiple output clock signals at independently selectable frequencies and phases, based upon the output from a single PLL 25. The generation of such multiple independently selectable frequencies is particularly useful in applications such as video decoder 80 described hereinabove, where a single clock generation circuit 22 provides synchronized clock signals to multiple circuit functions, each of which may require a different clock frequency for control thereof. FIG. 4 illustrates such an arrangement, in which PLL 25 provides multiple phases (numbering m) of a single frequency output signal to each of multiple frequency and phase synthesis circuits $27_0$ through $27_k$. Each of frequency and phase synthesis circuits $27_0$ through $27_k$ receive independent frequency select inputs on corresponding sets of input lines $FREQ_0$ through $FREQ_k$, responsive to which the frequency of the respective output clock signals $COUT_0$ through $COUT_k$ relative to the frequency output by PLL 25 may be set. As described above, the number of lines of each set of input lines FREQ (or at least one of the sets of input lines FREQ) exceeds the number required to select among the phases output by PLL 25. In the example of FIG. 4, where PLL 25 generates m phases of its clock signal, each of the frequency and phase synthesis circuits $27_0$ through $27_k$ receive j lines $FREQ_0$ through $FREQ_k$, respectively, where j>$\log_2$m. Of course, the numbers of lines FREQ received by each of frequency and phase synthesis circuits 27 need not all be alike; indeed, not all of the frequency and phase synthesis circuits $27_0$ through $27_k$ need receive full precision selection inputs, as the dock frequencies necessary for some circuit functions may not require full precision. As will be apparent from the following description, however, because the additional circuitry required to provide the improved precision according to the preferred embodiment of the invention is relatively modest, it is contemplated that all frequency and phase synthesis circuits $27_0$ through $27_k$ will be constructed to utilize the full precision input.

Referring back to FIG. 3, the construction of clock generation circuit 22, including the detailed construction frequency synthesis circuit 27, according to a first preferred embodiment of the invention will now be described. It is contemplated that, in the case where multiple frequency and phase synthesis circuits 27 are used such as is shown in FIG. 4, each of the frequency and phase synthesis circuits 27 will be similarly constructed.

Figure 1:
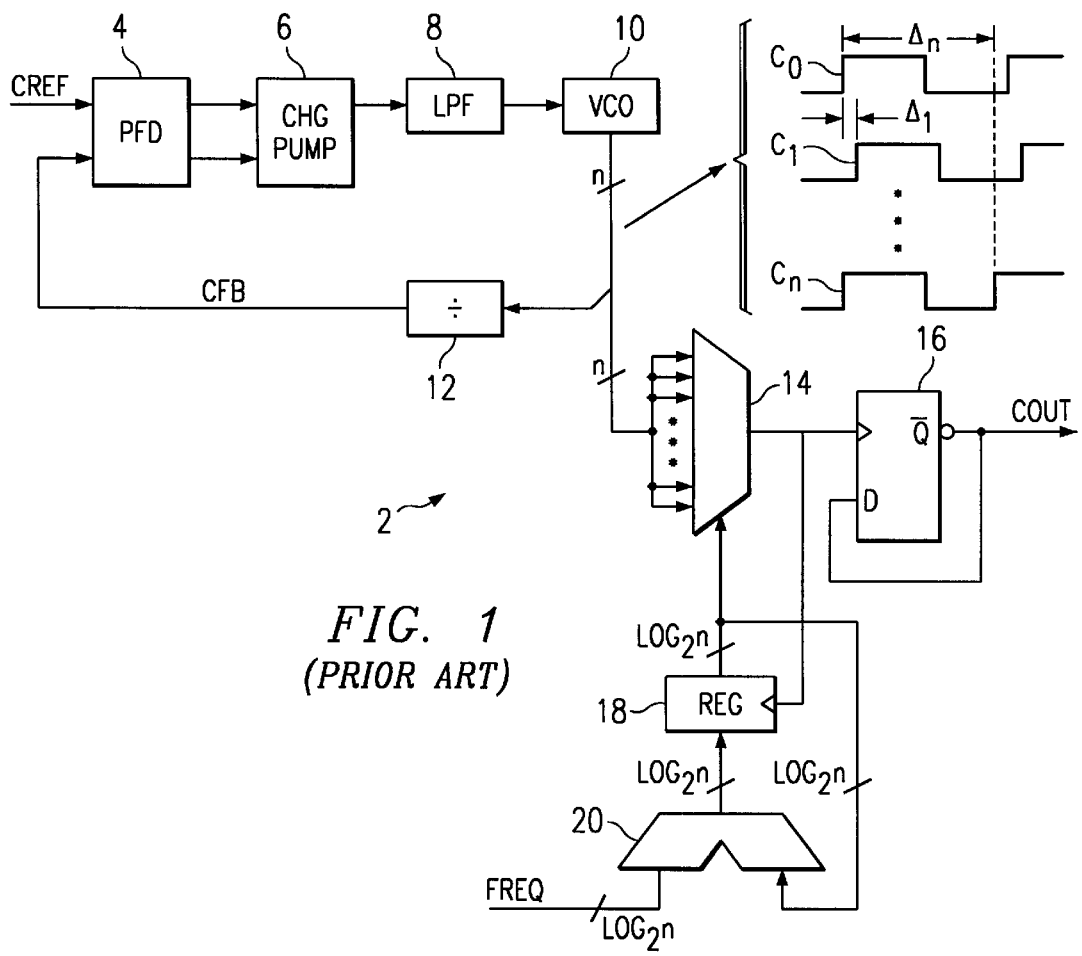
FIG. 1 is an electrical diagram, in block and schematic form, of a clock generation circuit showing the known concept of using multiple phases of the output of a phase-locked loop to synthesize frequency.

Phase-locked loop (PLL) 25 in clock generation circuit 22 according to this embodiment of the invention is of conventional construction, such as that described above relative to FIG. 1. As such, PLL 25 includes phase-frequency detector (PFD) 24 that compares the relative phases of a reference clock on line CREF and feedback clock on line CFB, and drives charge pump 26 in response thereto, to produce a voltage corresponding to this phase difference. Low pass filter 28 filters this voltage from charge pump 26 to produce a control voltage for voltage controlled oscillator (VCO) 30. VCO 30, in the conventional manner, generates a periodic waveform at a frequency controlled by the filtered output of low pass filter 28, which is of course based upon the phase difference detected by PFD 24. According to this example, VCO 10 provides thirt-two equally-spaced phases of its output clock signal; of course, the number of phases desired may vary from this exemplary number as desired. In the conventional manner, one of these clock signals is used as feedback clock CFB, after division by frequency divider 32.

The operation of PLL 25 follows that of conventional PLLs, such that the multiple-phase outputs from VCO 30 are at a frequency that is adjusted so that the feedback clock on line CFB becomes phase-synchronous with the reference clock CREF. After a sufficient number of cycles, and assuming a relatively stable reference clock CREF, the periodic clocks generated by VCO 10 will be locked onto the reference clock CREF, providing stable operation.

In the example of FIG. 2, in which clock generation circuit 22 is implemented within video decoder 80, the frequency of the clock signal on line CREF, generated from the sync pulses within the video input channels CH1, CH2, may be expected to fall within a relatively small range. In this case, the locking of PLL 25 may be assisted by an initialization clock circuit 33 which generates a clock signal, for example based upon external crystal 23, that is at a nominal frequency corresponding to the frequency expected from the video input signals; this clock signal may be initially applied to line CFB (by way of a control gate, not shown) so that the operation of PLL 25 may rapidly lock onto the reference clock on line CREF.

Referring again to FIG. 3, the construction of frequency synthesis circuit 27 according to this first preferred embodiment of the invention will now be described. The thirty-two clock phases generated by VCO 30 in PLL 25 are received at inputs of multiplexer 34. In this example, the selection performed by multiplexer 34 is controlled by five select lines SEL, because one of thirty-two clock phases are to be selected number ($\log_2$32=5). The selected one of the clock phases indicated by select lines SEL appears at the output of multiplexer 34 and is applied to the clock input of D-type flip-flop 36. Flip-flop 36 has its inverting output connected to its D input, so as to operate in toggle fashion. This inverting output of flip-flop 36 drives the output clock signal on line COUT.

The selection of clock phases made by multiplexer 34 according to this preferred embodiment of the invention is determined by the value presented on lines FREQ. According to the present invention, lines FREQ include both an integer portion and a fractional portion, with the integer portion having a number of bits corresponding to the number of select lines SEL, and thus corresponding to the number of clock phases output by VCO 30. In the example of frequency synthesis circuit 27 of FIG. 3, the five most significant bits of lines FREQ correspond to this integer portion. Lines FREQ also include additional lines, of less significance than the integer portion and thus corresponding to a fractional portion, to provide additional resolution in the selection of the time-averaged frequency of the output clock signal on line COUT. In this example shown in FIG. 3, five additional lines are provided for this fractional portion, so that the total number of lines FREQ number ten. These ten lines FREQ are applied to one input of adder 38.

Adder 38 is a ten bit adder in this example, for adding the digital value on lines FREQ with a ten-bit feedback value from the output of register 40; the output of adder 38 is applied to the input of register 40. Register 40 is a ten-bit register in this example, including a five-bit integer register and a five-bit fraction register, with both the integer and fraction registers clocked by the output of multiplexer 34. The output of the integer register of register 40 drives lines SEL applied to multiplexer 34, while the outputs of the integer register and the fraction register of register 40 are combined into a ten-bit value that is applied as a feedback value to adder 38 as noted above. In this way, adder 38 adds the current contents of register 40, which includes the current phase selection state applied to multiplexer 34 on lines SEL, to the frequency selection value on lines FREQ, for use in the selection of the next clock phase.

In operation, the digital value on lines FREQ thus corresponds to the number of phases output from VCO 30 that are to elapse between successive edges of the output clock signal on line COUT. According to this first preferred embodiment of the present invention and as noted above, this number of phases may be selected to have a fractional component, to provide additional precision in the average output frequency. Frequency synthesis circuit 27 generates this fractional frequency through the operation of adder 38 and register 40, in which fractional values accumulate and carry in such a manner as to modulate the integer output on lines SEL, and thus modulate the position of the clock edges selected by multiplexer 34.

One may derive the digital value to be applied on lines FREQ to select a desired frequency by considering the frequency output by VCO 30 and the number of available phases generated thereby. For example, consider VCO 30 as operating at 156.25 MHz (period of 6.4 nsec) to provide thirty-two evenly separated phases that are 0.2 nsec apart from one another. If ten lines FREQ are provided, five each for the integer and fractional portions, one may derive a time-average output period $t_{COUT}$:

$$t_{COUT}=\text{FREQ}[9:5].\text{FREQ}[4:0]\cdot 2\cdot 0.2 \text{ nsec}$$

The multiplication by two results from flip-flop 36 operating in toggle mode to generate alternating leading and trailing edges at its output on line COUT. Accordingly, the theoretical range of output period on line COUT provided by frequency synthesis circuit 27 in this example covers 0.4 nsec (FREQ=1; such that each phase from VCO 30 toggles flip-flop 36) to 12.8 nsec (FREQ=32).

Figure 5:
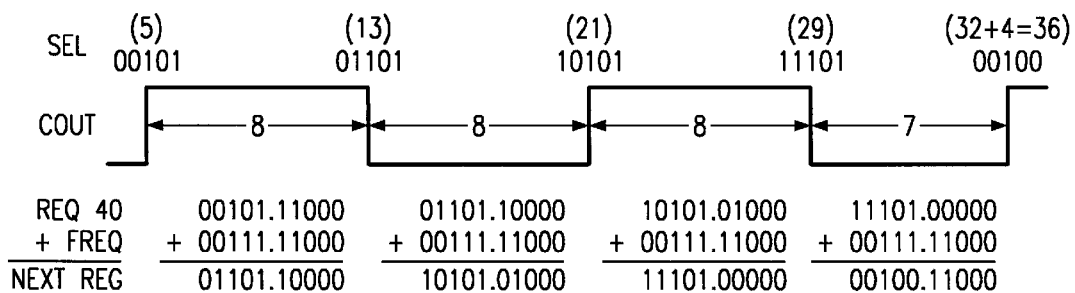
FIG. 5 is a timing diagram illustrating the operation of the clock generation circuit of FIG. 3 according to the first preferred embodiment of the invention.

Referring to FIG. 5, the operation of frequency synthesis circuit 27 will now be described in connection with an exemplary series of edges of output clock signal COUT as generated by frequency synthesis circuit 27, for the example in which the value 7.75 ($00111.11000_2$) appears on lines FREQ. The selected average output period $t_{COUT}$ in this example is therefore 3.10 nsec, according to the above expression (assuming the time difference between adjacent phases to be 0.2 nsec).

The example of FIG. 5 begins with register 40 in frequency synthesis circuit 27 initially storing the value $00101.11000_2$. This initial value of register 40 is simply an arbitrary value, provided for purposes of this description; as will become evident, the particular value stored in register 40 at any one time is not of specific importance, but rather the amount by which the contents of register 40 advance over time is of importance in generating the output clock signal. In the example of FIG. 5, the first edge of output clock COUT is generated by a select value of $00101_2$ ($5_{10}$) on lines SEL, as shown.

Adder 38 then adds the digital value on lines FREQ to the current value stored in register 40 to derive the next value to be applied on lines SEL, and accordingly the next phase output by VCO 30 to be selected by multiplexer 34 (by the integer portion) and the next feedback value to be added to the value on lines FREQ (both the integer and fraction portions). In this example, the current contents of register 40 of $00101.11000_2$ is added to the value on lines FREQ of $00111.11000_2$, to generate a new value $01101.10000_2$. The integer portion of this new value is $01101_2$ (or $13_{10}$), which advances the phase count by eight so that the next phase selected by multiplexer 34 is eight phases from the previous selected phase. The second edge of FIG. 5 is thus 1.6 nsec from the first (8·0.2 nsec).

Upon selection of this next phase, adder 38 again adds the current value $01101.10000_2$ in register 40 with the digital value $00111.11000_2$ on lines FREQ, to produce a new value $10101.0100_2$ that is then stored in register 40, the integer portion of which $10101_2$ ($21_{10}$) is applied to lines SEL to select the next phase of the output of VCO 30 for application to flip-flop 36. Again, eight phases, or 1.6 nsec, elapse between successive selected phases. Upon selection of this phase, adder 38 adds the value $10101.01000_2$ currently stored in register 40 to value $00111.11000_2$ on lines FREQ to produce a new value $11101.00000_2$, which generates a select value of $11101_2$ ($29_{10}$) on lines SEL that is again eight phases (1.6 nsec) from the previous phase; this value is, of course, again stored in register 40.

The fourth edge illustrated in FIG. 5 is then generated from the sum, performed by adder 38, of the contents $11101.00000_2$ of register 40, with the value $00111.11000_2$ on lines FREQ. This resulting new sum is the value $00100.11000_2$, with the carry out of the MSB ignored because only thirty-two phases are provided by VCO 30; this sum is, of course, stored in register 40 for use with the next edge. The integer portion of the new sum, $00100_2$ corresponds to the fourth phase in the next cycle of the output from VCO 30, which occurs only seven phases (1.4 nsec) after the previous phase (i.e., the new phase amounts to $32_{10}+4_{10}$, or $36_{10}$, which is seven phases different from the previous edge at $29_{10}$).

In this example, therefore, edges of output clock COUT are generated at eight, eight, eight, and seven, phases of the clock signal output by PLL 30. This sequence will repeat itself over multiple cycles, due to the operation of adder 38 and the accumulation of the fractional portion therein. A time average of the number of phases elapsing between edges is therefore 7.75, which corresponds to the digital value presented on lines FREQ as noted above; the average over time of the half-period of clock signal COUT will therefore be 1.55 nsec (i.e., the average of 1.6 nsec, 1.6 nsec, 1.6 nsec, and 1.4 nsec), deriving a time-average clock period $t_{COUT}$ of 3.10 nsec as desired.

The present invention therefore provides additional precision in the selection of an output frequency over conventional methods, and indeed additional precision over that provided by the multiple phase outputs of a conventional PLL. Of course, as is evident from the foregoing, this selected frequency is not necessary the instantaneous frequency, but is instead a time-averaged frequency; some amount of jitter, namely periodic jitter of one phase difference from the PLL (e.g., 0.2 nsec in the above example) also occurs. However, it is contemplated that such occasional jitter can be tolerated in many important applications, such as video decoder 80, especially considering that the clock generation circuit of the present invention is especially stable relative to phase drift. Such drift stability is apparent from the foregoing description, in that the fractional selection of frequency does not result in accumulation of error in the actual generation of the output clock signal, and thus does not itself involve any frequency drift. As a result, the clock signal generated by the clock generation circuit according to this first embodiment of the present invention can be used in high-precision applications such as video decoders, in which frequency error must be kept to extremely low levels over time.

Figure 6:
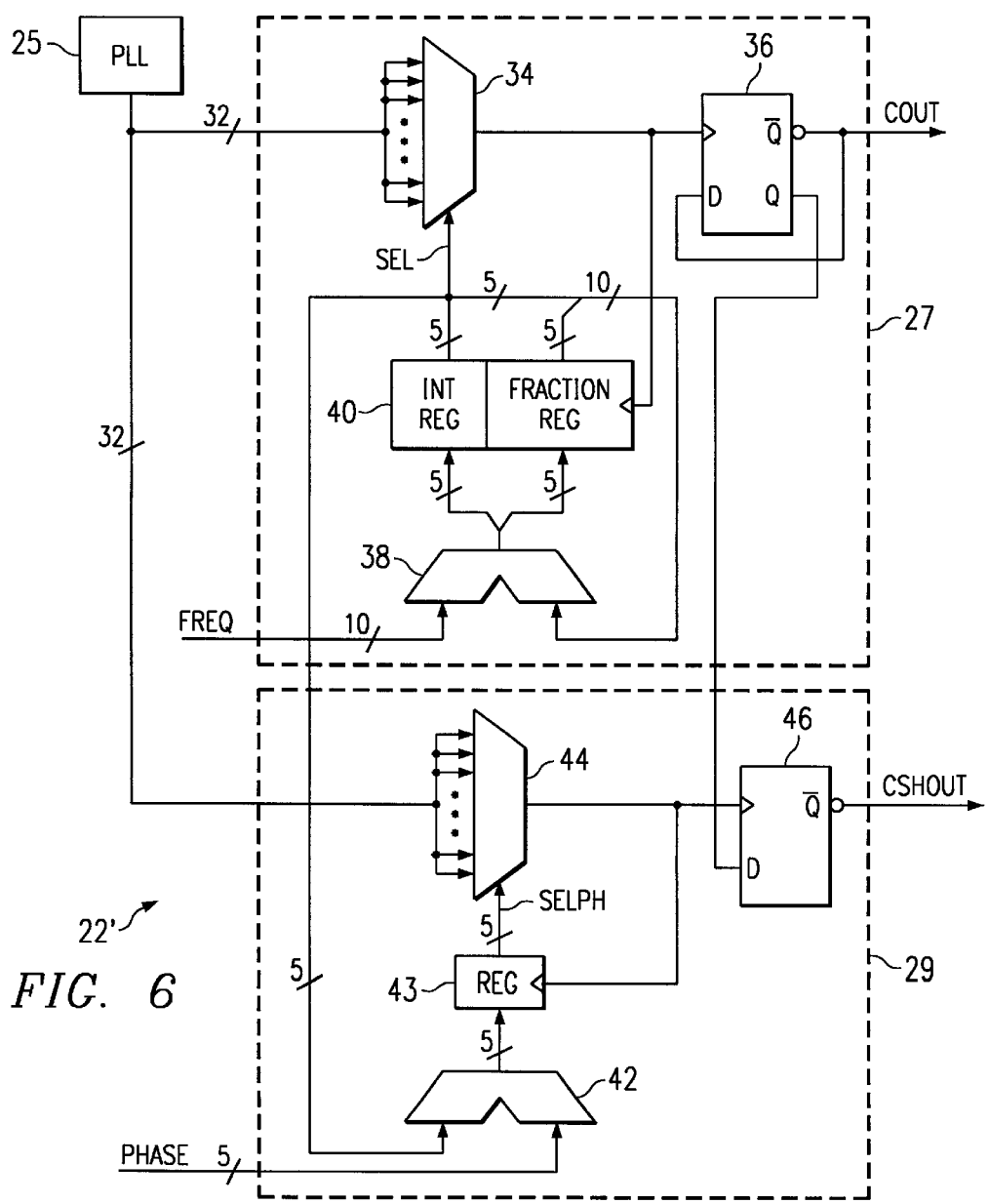
FIG. 6 is an electrical diagram, in block and schematic form, of a clock generation circuit constructed according to a second preferred embodiment of the invention.

Referring now to FIG. 6, the construction of clock generation circuit 22' according to a second preferred embodiment of the present invention will now be described in detail. Clock generation circuit 22' includes PLL 25 and frequency synthesis circuit 27, constructed as described above relative to FIGS. 3 and 5. According to this embodiment of the invention, clock generation circuit 22' includes phase synthesis circuit 29 for generating a second clock signal on line CSHOUT that is in a fixed phase relationship, and identical frequency, relative to the output clock signal on line COUT.

Phase synthesis circuit 29 includes multiplexer 44 which receives the multiple phases (thirty-two phases, in this example) generated by PLL 25, similarly as multiplexer 34 of frequency synthesis circuit 27; one of these phases, selected by the digital value presented thereto on lines SELPH, is forwarded to the clock input of D-type flip-flop 46. The D input of flip-flop 46 receives the non-inverting output of flip-flop 36 in frequency synthesis circuit 27, and generates the output clock signal on line CSHOUT from its inverting output.

Lines SELPH are generated from register 43, which in this example is a five-bit register for storing a selection value to be applied to multiplexer 44. The input to register 43 is adder 42, which adds the current value of lines SEL of frequency synthesis circuit 27 to a digital input value presented on lines PHASE from control circuitry elsewhere within the device containing clock generation circuit 22'. In this example, where thirty-two clock phases are presented to multiplexer 44, adder 42 is a five-bit adder, and lines PHASE number five.

In operation, a digital value is presented on lines PHASE according to the desired phase relationship between the clock signals on lines COUT, CSHOUT. This digital value is presented by way of a number of the clock phases generated by PLL 25, according to this embodiment of the invention. In operation, adder 42 adds the value on lines PHASE to the current value of the phase being selected in frequency synthesis circuit 27 as presented on lines SEL; the resulting sum is stored in register 43 (clocked by the output of multiplexer 44) and is then presented to multiplexer 44 on lines SELPH. Multiplexer 44 then selects the corresponding one of the phases from PLL 25 for application to the clock input of flip-flop 46. Upon the rising transition of this selected clock phase, flip-flop 46 stores the current contents of flip-flop 36 (non-inverted) and applies this state at its inverting output on line CSHOUT.

Accordingly, phase synthesis circuit 29 generates a clock signal on line CSHOUT that is at a fixed phase relationship relative to the clock signal on line COUT. This phase synchronization continues with each edge of the clock signal on line OUT, including those cycles in which the particular location of the transition varies from a typical value. As such, to the extent that jitter is present on line COUT, such jitter will also appear on line CSHOUT (delayed, of course, by the selected phase delay). Accordingly, this second preferred embodiment of the invention enables the generation of a phase-shifted output clock that similarly avoids drift over time.

As noted in the above description, a wide theoretical range of frequencies may be obtained from clock generation circuits 22, 22', up to a theoretical frequency in which each phase output by VCO 30 of PLL 25 serves to toggle the output clock. In practice, however, the maximum frequency obtainable is limited by the speed enabled by the manufacturing technology being utilized, specifically by the propagation speed of the datapath through adder 38 to update the phase selection of multiplexer 34. If, for example, adder 38 and register 40 are not capable of being updated in the time between the most recently passed phase and the next selected phase, clock edges may be missed.

Figure 7:
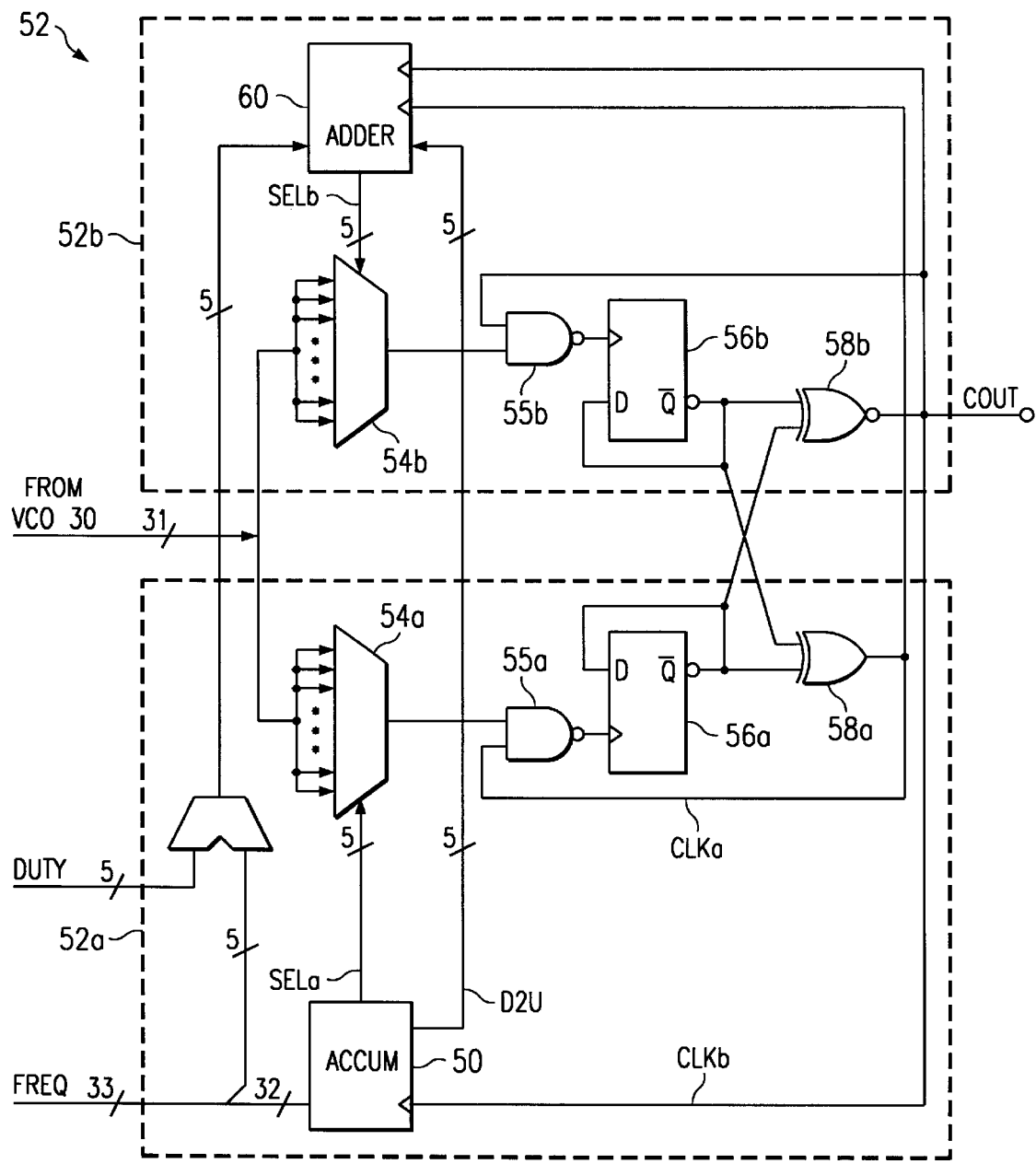
FIG. 7 is an electrical diagram, in block and schematic form, of a clock generation circuit constructed according to a third preferred embodiment of the invention.

Referring now to FIG. 7, frequency synthesis circuit 52 according to a third preferred embodiment of the invention will now be described in detail. Frequency synthesis circuit 52 generates a clock signal in a pipelined manner, so as to permit higher frequency output clocks nearing the theoretical limit. A single instance of frequency synthesis circuit 52 will be described hereinbelow for the example in which a single frequency clock will be generated. It is contemplated that those skilled in the art having reference to this specification will be able to provide phase synthesis capability in combination with frequency synthesis circuit 52, similarly as described in detail hereinabove relative to FIG. 6, as well as multiple frequency and phase synthesis capability, similarly as described above relative to FIG. 4, in connection with this embodiment of the present invention as well.

As shown in FIG. 7, frequency synthesis circuit 52 includes two paths 52a, 52b, for generating the leading and trailing edges of the output clock signal on line COUT, respectively. Each of paths 52a, 52b includes a respective thirty-two to one multiplexer 54a, 54b for selecting one of the thirty-two clock phases provided by VCO 30 of PLL 25 (FIG. 3) in response to select values presented on lines SELa, SELb, respectively. Because frequency synthesis circuit 52 effectively includes two interlocked thirty-two to one multiplexers 54, sixty-four potential phases are now available for use in the generation of the output clock signal on line COUT; as such, six integer bits are required to select among these potential phases. According to this preferred embodiment of the invention, frequency synthesis circuit 52 receives thirty-three digital lines FREQ; the most significant five bits FREQ[32:28] are forwarded, via adder 59, to adder 60 in path 52b for use in the generation of the trailing edge of the output clock signal, while the second through least significant bits FREQ[31:0] are forwarded to accumulator 50 in path 52a.

Adder 59 provides the optional feature of selecting the duty cycle of the output clock, by adding a five-bit value received on lines DUTY to the most significant bits of lines FREQ; the output of adder 59 is then applied to adder 60, for generation of the trailing edge of the output clock signal. For a fixed duty cycle clock, the most significant five bits FREQ[32:28] may be directly forwarded to adder 60.

According to this third embodiment of the present invention, the outputs of multiplexers 54a, 54b are respectively applied to one input of a corresponding NAND gate 55a, 55b. The outputs of NAND gates 55a, 55b are applied to the clock inputs of D-flip-flops 56a, 56b, respectively; each of flip-flops 56a, 56b are connected in toggle fashion, with their inverting outputs applied to their D inputs. The outputs of flip-flop 56a, 56b are each applied to the inputs of exclusive-OR gate 58a and exclusive-NOR gate 58b. Additionally, line CLKa is connected to a second input of NAND gate 55a and to a clock input of adder 60, and line CLKb is connected to a second input of NAND gate 55b and to clock inputs of accumulator 50 and adder 60.

In path 52a, multiplexer 54a is controlled by lines SELa generated by accumulator 50; similarly, in path 52b, multiplexer 54b is controlled by lines SELb generated by adder 60. Each of accumulator 50 and adder 60 are constructed in a pipelined fashion, according to this third preferred embodiment of the invention, so that accumulator 50 is performing the appropriate operations to generate its next value on lines SELa during such time as the trailing edge of the clock signal on line COUT is being generated by path 52b, and so that adder 60 is generating its next value for lines SELb during such time as the leading edge of the clock signal on line COUT is propagating through path 52a. Additionally, synchronization of paths 52a, 52b with one another is accomplished by lines D2U which effectively communicate the value on lines SELa from accumulator 50 to adder 60. The pipelined construction of accumulator 50 and adder 60 will now be described in detail relative to FIGS. 8 and 9.

Figure 8:
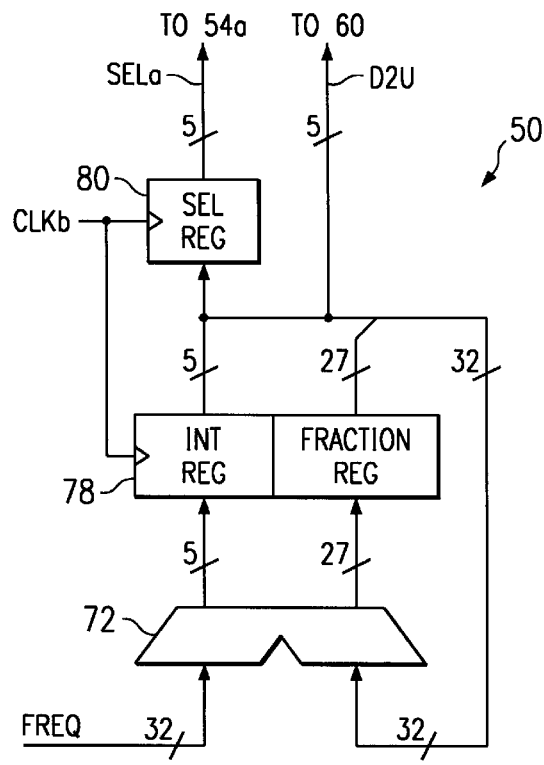
FIG. 8 is an electrical diagram, in block and schematic form, of a pipelined accumulator in the clock generation circuit of FIG. 7 according to the third preferred embodiment of the invention.

FIG. 8 illustrates the construction of accumulator 50 in frequency synthesis circuit 52 according to this third preferred embodiment of the invention. As noted above, the second through least significant ones of lines FREQ are received by accumulator 50 and, in this exemplary implementation, are applied to one input of thirty-two bit adder 72; the second input to adder 72 is a thirty-two bit feedback value from register 78 in accumulator 50.

Adder 72 generates a five-bit integer result and a twenty-seven bit fraction result, which are applied to integer and fraction portions, respectively, of register 78. The integer portion of register 78 is then forwarded from the output of register 78 to select register 80; both of registers 78, 80 are clocked by the clock signal on line CLKb, so as to store results from successive cycles in a pipelined fashion. The integer output from register 78 is also forwarded to adder 60 on lines D2U, and is combined with the fraction output from register 78 to provide the thirty-two bit feedback value that is forwarded back to adder 72. The state of select lines SELa is output by select register 80, as shown in FIG. 8.

According to this embodiment of the invention, thirty-two phases are generated by VCO 30 of PLL 25. It is contemplated that some VCOs may be constructed in a ring oscillator fashion, so as to generate an odd number of phases (which are therefore not a power-of-two). In such a case, accumulator 50 would preferably include an additional adder stage, for example disposed between adder 72 and register 78, that would detect a carry in the sum from adder 72 that exceeds the number of available phases, and that would advance the integer portion stored in register 78 in this event. It is contemplated that those skilled in the art having reference to this specification would be readily able to implement such modulo-based logic herein.

Figure 9:
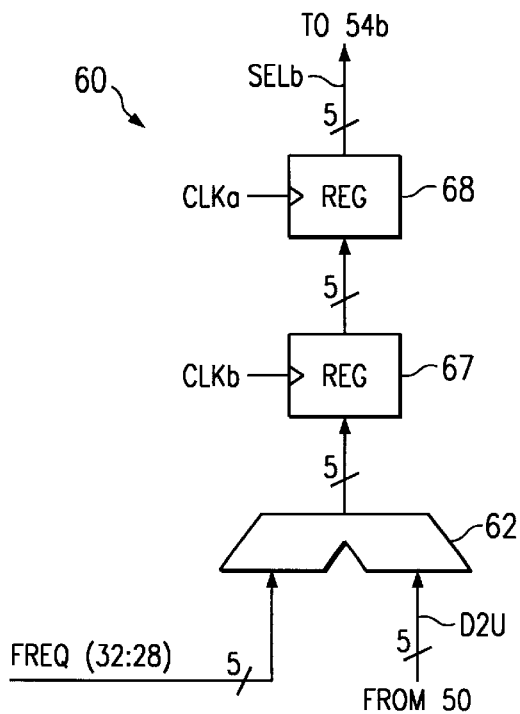
FIG. 9 is an electrical diagram, in block and schematic form, of a pipelined adder in the clock generation circuit of FIG. 7 according to the third preferred embodiment of the invention.

Referring now to FIG. 9, the construction of adder 60 will now be described. The five most significant lines FREQ [32:28] (added with the value of lines DUTY if adder 59 is implemented) are applied to one input of adder 62; the second input to adder 60 is received from accumulator 50 on lines D2U. As such, adder 62 serves to add the integer portion of the input on lines FREQ to a value corresponding to the current state of lines SELa to be applied to multiplexer 64a in path 52a. The five-bit result from adder 62 is stored in first register 67, which is clocked by line CLKb; the output from first register 67 is stored in second register 68, which is clocked by line CLKa. The output from register 68 drives lines SELb which are applied to multiplexer 54b in path 52b. Registers 67, 68 thus provide a pipeline function, to permit adder 60 to generate the next value to be applied to multiplexer 54b while accumulator 50 is controlling the selection of a phase via multiplexer 54a.

As noted above, in the event that an odd or non-power-of-two number of phases are generated by VCO 30 in PLL 25, additional modulo arithmetic logic may be inserted into adder 60 between adder 62 and first register 67, to advance the count in the event of a modulo carry.

Referring back to FIG. 7, the operation of frequency synthesis circuit 52 according to this third preferred embodiment of the invention will now be described in detail. As in the previously described embodiments, control circuitry elsewhere within the integrated circuit in which frequency synthesis circuit 52 will provide a digital word on lines FREQ indicating the frequency at which the clock signal on line COUT is to be generated; again, this indication is provided by the digital word on lines FREQ indicating the number of phases of the output of PLL 25 between adjacent edges of the output clock. The digital word on lines FREQ will, according to the present invention, include an integer portion and a fraction portion which together set the time-averaged frequency of the clock signal on line COUT. Optionally, this control circuitry also provides a duty cycle selection value on lines DUTY to adder 59.

During generation of the leading edge of the output clock signal, line CLKa is high, which enables the output of multiplexer 54a to toggle flip-flop 56a. Also at this time, line CLKb is low. As is evident from FIG. 7, lines CLKa, CLKb are necessarily complementary to one another, considering that exclusive-OR gate 58a and exclusive-NOR gate 58b receive the same inputs but generate opposite output states relative to one another. The following description will begin with the initial states of the outputs of flip-flops 56a, 56b opposite from one another, such that line CLKa is high and line CLKb and line COUT are low.

Referring now to FIGS. 7 and 8 in combination, at this point in time the currently stored integer value in register 80 has been applied to multiplexer 54a to select a corresponding phase of the output of VCO 30. Upon a trailing edge of this selected phase, which passes to NAND gate 55a through multiplexer 54a, the output of NAND gate 55a makes a low-to-high transition, which toggles flip-flop 56a to now match the output of flip-flop 56b (these states being complementary previously). This toggling causes the output of exclusive-OR gate 58a to make a high-to-low transition, and also causes the output of exclusive-NOR gate 58b to make a low-to-high transition, thus issuing a rising edge of the output clock on line COUT and driving line CLKb from low to high. Line CLKa is of course driven low by exclusive-OR gate 58a, locking out NAND gate 55a from responding to the output of multiplexer 54a.

During such time as the rising edge of the output clock is being generated through path 52a, path 52b is updating the value of its selection integer to be applied to multiplexer 54b on lines SELb. Referring to FIGS. 7 and 9, during such time as line CLKa is high and line CLKb is low, the output of NAND gate 55b is forced high, blocking pulses from multiplexer 54b from affecting the state of flip-flop 56b.

The updating of path 54b is accomplished through the operation of adder 62 adding the integer portion of lines FREQ to the current value of the integer portion of register 78 in accumulator 50, presented on lines D2U, to provide a new integer sum. Upon the low-to-high transition of line CLKb, this new value is stored into register 67 (the previous contents of which were stored in register 68 in the previous cycle of line CLKa).

Once line CLKa is low and line CLKb is high, path 52b selects the phase from VCO 30 for use in generating the trailing edge on line COUT. The contents of register 68 are applied to multiplexer 54b. The next trailing edge of this phase is then passed to NAND gate 55b which, because line CLKb is now high, toggles the state of flip-flop 56b, causing its output to now differ from that of flip-flop 56a. This state causes exclusive-NOR gate 58b to drive line COUT low again, along with line CLKb. These same inputs cause exclusive-OR gate 58a to drive a low-to-high transition at its output on line CLKa.

During this time in which line CLKa is low, blocking transitions from multiplexer 54a from toggling flip-flop 56a, accumulator 50 is updating its contents for the next cycle. In this regard, the digital word on lines FREQ is first added by adder 72 to the current contents of register 78 (see FIG. 8), which corresponds to the integer value currently being applied to multiplexer 54a appended with the accumulated fractional portion stored in register 78. The sum of this addition is then stored in register 78 upon the low-to-high transition of line COUT. The integer contents of register 78 are also loaded into the next register 80 upon this transition, as well.

In this manner, each of accumulator 50 and adder 60 include two stages of register pipelining. This pipelining, and the interlocking of paths 52a and 52b by exclusive-OR gate 58a and exclusive-NOR gate 58b, permits the updating of the multiplexer selection words in each path while the opposite path is propagating the clock edge. In addition, the use of two paths splits the timing requirements of the logic operation to be performed in each half-cycle of the output clock, thus permitting the generation of an output clock that can approach the theoretical frequency limit. These dual pipelined paths enable the clock generation circuitry to not only provide precise selection of clock frequencies with minimal drift, but in such a manner that permits extremely high frequency operation, without requiring the adders to operate at twice the VCO frequency. It is therefore contemplated that such pipelning and dual path operation is particularly preferred for high performance applications, such as video decoders.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

We claim:

1. A clock generator circuit, comprising:
   a phase-locked loop, for generating a plurality of phases of a locked clock signal; and
   a frequency synthesis circuit, for generating a first output clock signal from the plurality of phases of the locked clock signal, comprising:
      a first multiplexer, having a plurality of inputs, each for receiving one of the plurality of phases of the locked clock signal, having an output for presenting a selected one of the plurality of phases responsive to a select value received at a control input;
      a first select circuit, having a first input for receiving a first frequency select value having an integer portion and a fraction portion, and having an output coupled to the control input of the first multiplexer, the first select circuit for repetitively generating a select value corresponding to the integer portion of a sum, including integer and fraction portions, of the first frequency select value, and a previous such sum value including integer and fraction portions; and
      a first toggle circuit, having a clock input coupled to the output of the first multiplexer, for generating a signal transition at an output thereof responsive to receiving a clock phase at its clock input;
   wherein the first output clock signal corresponds to the output of the first toggle circuit.

2. The clock generator circuit of claim 1, wherein the first select circuit comprises:
   a first adder, having a first input for receiving the first frequency select value, including said integer portion and said fraction portion thereof; the adder having a second input and an output;
   a first register, having an input coupled to the output of the first adder, and having an integer portion and a fraction portion, having an integer output coupled to the control input of the first multiplexer for presenting a content of the integer portion of the register thereto, and having a fraction output for presenting the contents of the fraction portion of the register;
   wherein the integer output and fraction output of the first register correspond to the previous sum, and are applied to the second input of the first adder.

3. The clock generator circuit of claim 2, wherein the first toggle circuit comprises:
   a first toggle flip-flop, having a clock input coupled to the output of the first multiplexer, the first toggle flip-flop operable to change its stored state responsive to receiving a clock phase at its clock input, and having an output for presenting a stored state thereof, wherein the first output clock signal corresponds to the state at the output of the first toggle flip-flop.

4. The clock generator circuit of claim 3, wherein the integer portion of the first register is capable of storing a number of bits, and wherein the number of bits of the integer portion of the first register is sufficient to uniquely select one of the plurality of phases of the locked clock signal.

5. The clock generator circuit of claim 4, wherein the fraction portion of the first register is capable of storing a number of bits, and wherein the number of bits of the fraction portion of the first register is greater than or equal to the number of bits of the integer portion of the first register.

6. The clock generator circuit of claim 3, further comprising:
   a phase synthesis circuit for generating a phase shifted signal that is at a selected phase relative to the first output clock signal, comprising:
      a phase multiplexer, having a plurality of inputs, each for receiving one of the plurality of phases of the locked clock signal, having an output for presenting a selected one of the plurality of phases responsive to a select value received at a control input;
      a phase select register, having an output coupled to the control input of the phase multiplexer, and having an input;
      a phase adder, having a first input receiving a phase shift select value, having a second input receiving the integer output of the first register, and having an output coupled to the input of the phase select register; and
      a phase toggle flip-flop, having a clock input coupled to the output of the phase multiplexer, the phase toggle flip-flop operable to change its stored state responsive to receiving a clock phase at its clock input, and having an output for presenting its stored state, wherein the phase shifted signal corresponds to the state at the output of the phase toggle flip-flop.

7. The clock generator circuit of claim 3, wherein the frequency synthesis circuit comprises first and second paths;
   wherein the first path comprises the first multiplexer, the first toggle flip-flop, the first register, and the first adder;
   wherein the first path further comprises:
      a first blocking gate, for selectively blocking phases at the output of the first multiplexer from appearing at the clock input of the first toggle flip-flop responsive to a second control clock;
   wherein the second path comprises:
      a second adder, having a first input coupled to receive a portion of the first frequency select value, and having a second input for receiving the integer portion of the first register, and having an output;
      a second register, having an input coupled to the output of the second adder and having an output;
      a second multiplexer, having a plurality of inputs, each for receiving one of the plurality of phases of the locked clock signal, having an output for presenting a selected one of the plurality of phases responsive to a select value received from the output of the second register at a control input;
      a second toggle flip-flop, having a clock input coupled to the output of the second multiplexer, the second toggle flip-flop operable to change its stored state responsive to receiving a clock phase at its clock input, and having an output for presenting its stored state; and a second blocking gate, for selectively blocking phases at the output of the second multiplexer from appearing at the clock input of the second toggle flip-flop responsive to a first control clock;

and further comprising:

exclusive-OR logic for generating the first and second control clocks, complementary to one another, responsive to the outputs of the first and second toggle flip-flops;

wherein the first output clock signal corresponds to the state of the second control clock.

8. The clock generator circuit of claim 7, wherein the first path further comprises:

a first pipeline register, having an input coupled to the output of the first register and an output coupled to the control input of the first multiplexer, for storing a previous value of the integer portion of the first register;

and wherein the second path further comprises:

a second pipeline register, having an input coupled to the output of the second register and an output coupled to the control input of the second multiplexer, for storing a previous value of the second register.

9. The clock generator circuit of claim 7, wherein the second path further comprises:

a duty cycle adder, having an input for receiving a portion of the first frequency select value, having an input for receiving a duty cycle value, and having an output coupled to the first input of the second adder, for presenting thereat a sum of the first frequency select value and the duty cycle value.

10. The clock generator circuit of claim 1, further comprising:

a second frequency synthesis circuit, having a plurality of inputs, each for receiving one of the plurality of phases of the locked clock signal, for generating a second output clock signal from the plurality of phases of the locked clock signal at a frequency corresponding to a second frequency select value.

11. A method of generating a clock signal at a selected frequency, comprising:

generating a plurality of phases of a locked clock signal from a phase-locked loop, the locked clock signal being phase-locked relative to a reference clock signal;

adding a first frequency select value including an integer portion and a fraction portion with a feedback value including an integer portion and a fraction portion;

storing the result of the adding step in a register having an integer portion and a fraction portion;

selecting one of the plurality of phases of the locked clock signal according to the value of the integer portion of the register;

toggling a flip-flop responsive to a transition of the selected phase of the clock signal to generate the clock signal;

producing the feedback value from the combination of the value of the integer portion of the register and the value of the fraction portion of the register; and repeating the adding, storing, selecting, toggling, and producing steps.

12. The method of claim 11, further comprising:

adding a phase shift select value with the value of the integer portion of the register;

storing the result of the adding step in a phase register; and selecting one of the plurality of phases of the locked clock signal responsive to the value of the phase register to generate a phase shifted clock signal.

13. The method of claim 11, wherein the adding, storing, selecting, toggling, and producing steps are performed by a first frequency synthesis circuit to produce a first clock signal at a first selected frequency;

and further comprising, with a second frequency synthesis circuit:

adding a second frequency select value including an integer portion and a fraction portion with a feedback value including an integer portion and a fraction portion;

storing the result of the adding step in a register having an integer portion and a fraction portion;

selecting one of the plurality of phases of the locked clock signal according to the value of the integer portion of the register;

toggling a flip-flop responsive to a transition of the selected phase of the clock signal to generate a second clock signal;

producing the feedback value from the combination of the value of the integer portion of the register and the value of the fraction portion of the register; and repeating the adding, storing, selecting, toggling, and producing steps with the second frequency synthesis circuit.

14. A method of generating a clock signal at a selected frequency, comprising:

generating a plurality of phases of a locked clock signal from a phase-locked loop, the locked clock signal being phase-locked relative to a reference clock signal;

generating a leading edge of the clock signal by:

adding a frequency select value including an integer portion and a fraction portion with a feedback value including an integer portion and a fraction portion;

storing the result of the adding step in a first register having an integer portion and a fraction portion;

selecting one of the plurality of phases of the locked clock signal according to the value of the integer portion of the first register;

toggling a flip-flop responsive to a transition of the selected phase of the clock signal to produce a first control clock;

producing the feedback value from the combination of the value of the integer portion of the first register and the value of the fraction portion of the register; and repeating the adding, storing, selecting, toggling, and producing steps; and generating a trailing edge of the clock signal by:

adding a portion of the first frequency select value to the value of the integer portion of the first register;

storing the result of the adding step in a second register;

selecting one of the plurality of phases of the locked clock signal according to the value of the second register;

toggling a second flip-flop responsive to a transition of the selected phase of the clock signal to produce a second control clock;

repeating the adding, storing, selecting, and toggling steps;

wherein the clock signal at the selected frequency corresponds to the second control clock.

15. The method of claim 14, further comprising:

blocking the toggling of the first flip-flop during the generating of the trailing edge of the clock signal; and blocking the toggling of the second flip-flop during the generating of the leading edge of the clock signal.

16. The method of claim 14, wherein the adding, storing, and selecting steps in the generating of the trailing edge of the clock signal are performed during the toggling and applying steps in the generating of the leading edge of the clock signal;

and wherein the adding, storing, and selecting steps in the generating of the leading edge of the clock signal are performed during the toggling and applying steps in the generating of the trailing edge of the clock signal.

17. The method of claim 14, wherein the storing step in the generating of the trailing edge of the clock signal is clocked by the second control clock:

and wherein the generating of the trailing edge of the clock signal further comprises:

storing the contents of the second register into a pipelined register responsive to the first control clock.

18. The method of claim 14, further comprising:

adding a duty cycle value to a portion of the first frequency select value, so that the result of the adding step stored in a second register in the storing step corresponds to the sum of the duty cycle value with the first frequency select value and the value of the integer portion of the first register.

19. An electronic system, comprising:

a source of a reference clock;

a functional circuit, operable to perform a function in a synchronous manner relative to a first clock signal; and a clock generator circuit, comprising:

a phase-locked loop, for generating a plurality of phases of a locked clock signal relative to the reference clock; and a frequency synthesis circuit, for generating a first output clock signal from the plurality of phases of the locked clock signal, comprising:

a first multiplexer, having a plurality of inputs, each for receiving one of the plurality of phases of the locked clock signal, having an output for presenting a selected one of the plurality of phases responsive to a select value received at a control input;

a first select circuit, having a first input for receiving a first frequency select value having an integer portion and a fraction portion, and having an output coupled to the control input of the first multiplexer, the first select circuit for repetitively generating a select value corresponding to the integer portion of a sum of the first frequency select value, including its integer and fraction portions, and a previous sum value including integer and fraction portions; and a first toggle circuit, having a clock input coupled to the output of the first multiplexer, for generating a transition at an output thereof responsive to receiving a clock phase at its clock input;

wherein the first output clock signal corresponds to the output of the first toggle circuit.

20. The system of claim 19, wherein the first select circuit comprises:

a first adder, having a first input for receiving the first frequency select value, including integer portion and a fraction portion; the adder having a second input and an output;

a first register, having an input coupled to the output of the first adder, and having an integer portion and a fraction portion, having an integer output coupled to the control input of the first multiplexer for presenting the contents of the integer portion of the register thereto, and having a fraction output for presenting the contents of the fraction portion of the register;

wherein the integer output and fraction output of the first register correspond to the previous sum, and are applied to the second input of the first adder;

and wherein the first toggle circuit comprises:

a first toggle flip-flop, having a clock input coupled to the output of the first multiplexer, the first toggle flip-flop operable to change its stored state responsive to receiving a clock phase at its clock input and having an output for presenting its stored state, wherein the first output clock signal corresponds to the state at the output of the first toggle flip-flop.

21. The system of claim 20, wherein the clock generator circuit further comprises:

a phase synthesis circuit for generating a phase shifted signal that is at a selected phase relative to the first output clock signal, comprising:

a phase multiplexer, having a plurality of inputs, each for receiving one of the plurality of phases of the locked clock signal, having an output for presenting a selected one of the plurality of phases responsive to a select value received at a control input;

a phase select register, having an output coupled to the control input of the phase multiplexer, and having an input;

a phase adder, having a first input receiving a phase shift select value, having a second input receiving the integer output of the first register, and having an output coupled to the input of the phase select register; and a phase toggle flip-flop, having a clock input coupled to the output of the phase multiplexer, the phase toggle flip-flop operable to change its stored state responsive to receiving a clock phase at its clock input, and having an output for presenting its stored state, wherein the phase shifted signal corresponds to the state at the output of the phase toggle flip-flop.

22. The system of claim 20, wherein the frequency synthesis circuit comprises first and second paths;

wherein the first path comprises the first multiplexer, the first toggle flip-flop, the first register, and the first adder;

wherein the first path further comprises:

a first blocking gate, for selectively blocking phases at the output of the first multiplexer from appearing at the clock input of the first toggle flip-flop responsive to a second control clock;

wherein the second path comprises:

a second adder, having an input for receiving a portion of the first frequency select value, and having an input for receiving the integer portion of the first register, and having an output;

a second register, having an input coupled to the output of the second adder and having an output;

a second multiplexer, having a plurality of inputs, each for receiving one of the plurality of phases of the locked clock signal, having an output for presenting a selected one of the plurality of phases responsive to a select value received from the output of the second register at a control input;

a second toggle flip-flop, having a clock input coupled to the output of the second multiplexer, the second toggle flip-flop operable to change its stored state responsive to receiving a clock phase at its clock input, and having an output for presenting its stored state; and a second blocking gate, for selectively blocking phases at the output of the second multiplexer from appearing at the clock input of the second toggle flip-flop responsive to a first control clock;

and further comprising:

exclusive-OR logic for generating the first and second control clocks, complementary to one another, responsive to the outputs of the first and second toggle flip-flops;

wherein the first output clock signal corresponds to the state of the second control clock.

23. The system of claim 19, wherein the clock generator circuit comprises:

a second frequency synthesis circuit, having a plurality of inputs, each for receiving one of the plurality of phases of the locked clock signal, for generating a second output clock signal from the plurality of phases of the locked clock signal at a frequency corresponding to a second frequency select value.

24. The system of claim 19, wherein the functional circuitry is for performing a video decoding function.

* * * * *